United States Patent
Vongfuangfoo et al.

[11] Patent Number: 5,972,738
[45] Date of Patent: Oct. 26, 1999

[54] PBGA STIFFENER PACKAGE

[75] Inventors: Sutee Vongfuangfoo, Sunnyvale; Brent Bacher, Fremont; Felipe Sumagaysay, Newark, all of Calif.

[73] Assignee: LSI Logic Corporation, Milpitas, Calif.

[21] Appl. No.: 08/852,597

[22] Filed: May 7, 1997

[51] Int. Cl.⁶ .......................... H01L 21/52; H01L 21/58; H01L 21/60
[52] U.S. Cl. ...................... 438/124; 438/120; 29/25.01
[58] Field of Search ...................... 438/124, 126, 438/FOR 371, FOR 374, FOR 375, FOR 379, FOR 381, FOR 384, FOR 436; 29/25.01

[56] References Cited

U.S. PATENT DOCUMENTS

| | | |
|---|---|---|
| 3,435,516 | 4/1969 | Kilby . |
| 3,885,304 | 5/1975 | Kaiser et al. . |
| 4,218,701 | 8/1980 | Shirasaki . |
| 4,264,917 | 4/1981 | Ugon . |
| 4,372,037 | 2/1983 | Scapple et al. . |
| 4,558,510 | 12/1985 | Tani et al. . |
| 4,814,943 | 3/1989 | Okuaki . |
| 5,041,395 | 8/1991 | Steffen . |
| 5,057,460 | 10/1991 | Rose . |
| 5,173,766 | 12/1992 | Long et al. . |
| 5,219,794 | 6/1993 | Satoh et al. . |
| 5,436,203 | 7/1995 | Lin . |
| 5,547,730 | 8/1996 | Weiblen et al. . |
| 5,610,442 | 3/1997 | Schneider et al. . |
| 5,616,520 | 4/1997 | Nishiuma et al. . |
| 5,700,697 | 12/1997 | Dlugokecki . |
| 5,786,631 | 7/1998 | Fishley et al. . |
| 5,804,467 | 9/1998 | Kawahara et al. . |

Primary Examiner—David E. Graybill

[57] ABSTRACT

A PBGA package includes PBGA member, a stiffener ring, and a stiffener fixture which includes a retaining recess having a floor for receiving the stiffener ring and includes a ledge positioned above the recess floor for receiving the PBGA member. An adhesive layer is applied to the stiffener ring, which is adhered to the PBGA member. The stiffener ring and PBGA member are essentially coplanar to less than 8 mils. A top plate is placed on top of the PBGA member and the ring and member are secured together tightly.

9 Claims, 3 Drawing Sheets

PBGA STIFFENER PACKAGE

BACKGROUND OF THE INVENTION

1. Field of the Invention.

This invention relates to a Plastic Ball Grid Array ("PBGA") stiffener package and method of manufacturing same.

2. Discussion of Related Technology.

Referring to FIG. 1, previously, in the manufacturing of PBGA packages 10, a thixotropic damming compound, formed as a damming ring 12, was used to surround an integrated circuit die 16 attached to an individual PBGA member 22. Bond wires 18 were then attached to the die 16 to form electrical interconnects with signal tracks 42 (FIG. 4a), which in turn connected to solder ball pads 52 (FIG. 4b) on the solder ball attach surface 50 on the underside of the PBGA member 22. Solder ball 20 were then attached to selected pads 52. Inside the perimeter of damming ring 12, a low stress epoxy was then applied to form an encapsulate 14 over the die 16 and the interconnect bold wires 18.

The resulting prior art PBGA package 10 shown in FIG. 1, typically had a coplanarity of, at best, about 18 mil (0.018 inches). This degree of coplanarity has become increasingly unacceptable for many customers who find that PBGA packages manufactured in this fashion contain shorting at the solder ball connections due to package warpage. Alternate existing methods of construction, which include overmoled PBGA packages and glob top PBGA packages, have distinct disadvantages as well. Overmoled PBGA packages require lengthy cycle times and relatively high associated tooling costs. Glob top PBGA packages frequently fail the reduced coplanarity requirement of customers by allowing too much package warpage causing electrical disconnects at the solder joints.

Many customers now demand coplanarity for a PBGA package to be less than 8 mils. Thus, the need has arisen for a PBGA package, and method of manufacturing same, which results in a coplanarity of less than 8 mil to prevent inadvertent electrical disconnects at the solder joints through ensured PBGA package coplanarity, rigidity and board mountability.

SUMMARY OF THE INVENTION

Embodiments of a PBGA package and method of manufacturing include a PBGA member, a metal stiffener ring, and a stiffener fixture which includes a retaining recess having a floor for receiving the stiffener ring and includes a ledge positioned above the recess floor for receiving the PBGA member. An adhesive layer of an epoxy is applied to the stiffener ring, which is adhered to the PBGA member. The stiffener ring and PBGA member are essentially coplanar to less than 8 mils. A top plate is placed on top of the PBGA member which secures tightly together the ring and member by clamping the top plate to the fixture, creating an assembly. The entire assembly is then heated to cure the adhesive layer to bond together the stiffener ring and the PBGA member. Die attach, wire bonding, encapsulation and solder ball attachment are then carried out.

The PBGA stiffener package, and method of manufacturing same, described herein eliminates the use of an epoxy damming ring through the use of a metal stiffener ring. Because of the increased rigidity of the metal stiffener ring, the coplanarity of the PBGA package is reduced from 18 mil to less than 8 mil. Additionally, the cycle time of manufacturing is reduced, and tooling costs are realized in comparison to the overall molding processes.

DETAILED DESCRIPTION OF THE PREFERRED EMBODIMENTS

Figure 4A:
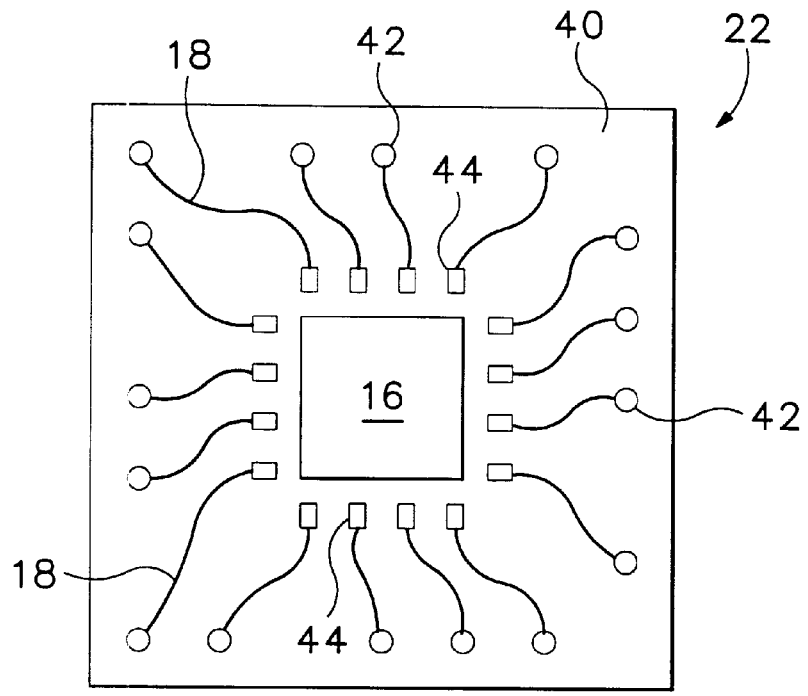
FIG. 4a illustrates an embodiment of the die attach surface of the PBGA member.
Figure 4B:
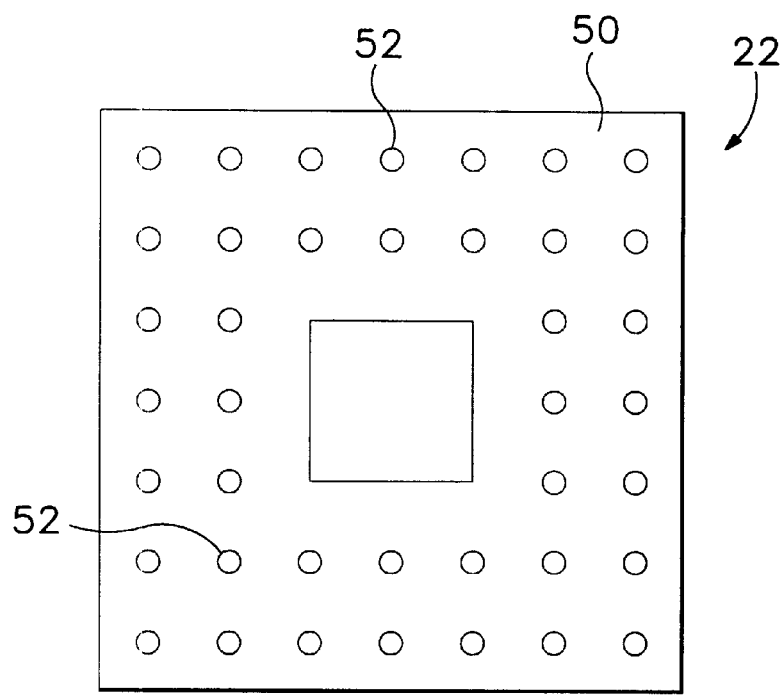
FIG. 4b illustrates an embodiment of the solder ball attach surface of the PBGA member.

Plastic Ball Grid Array (PBGA) members typically arrive for assembly joined together in strips of five, or any other number. The members are singulated and then prepared for a metal stiffener attach process. Each PBGA member 22 includes a die attach surface 40 (FIG. 4a) and a solder ball attach surface 50 (FIG. 4b).

Figure 1:
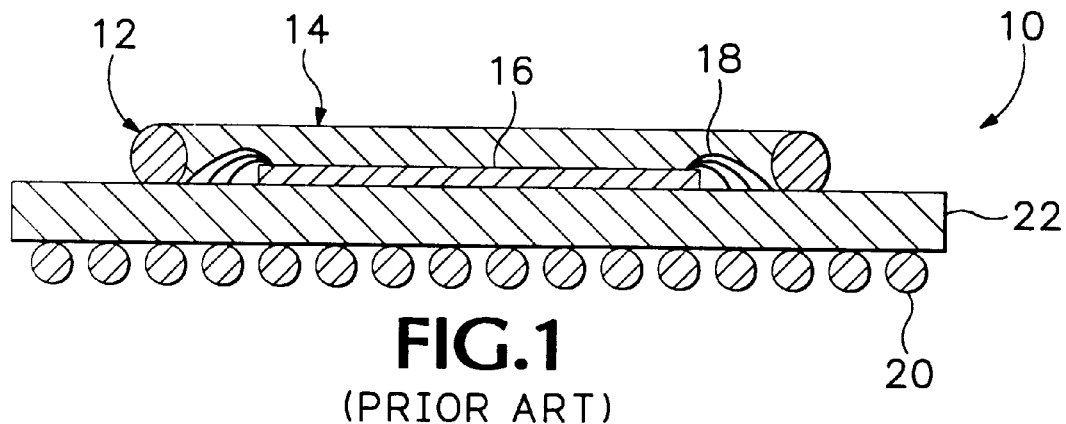
FIG. 1 schematically illustrates a cross section of a PBGA package of the prior art having a damming ring.
Figure 2:
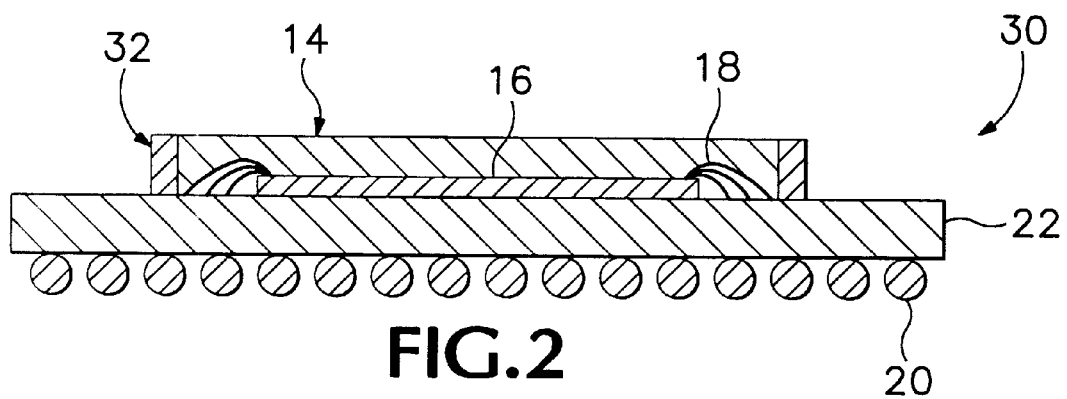
FIG. 2 schematically illustrates an embodiment of a PBGA package of the present invention.
Figure 3:
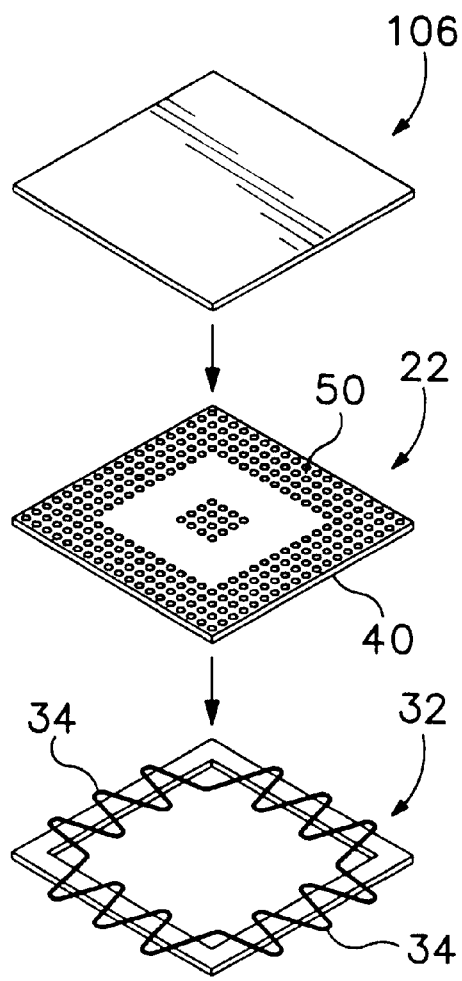
FIG. 3 illustrates an exploded view of the components used an the embodiment of the manufacturing of a PBGA package of the present invention.
Figure 3:
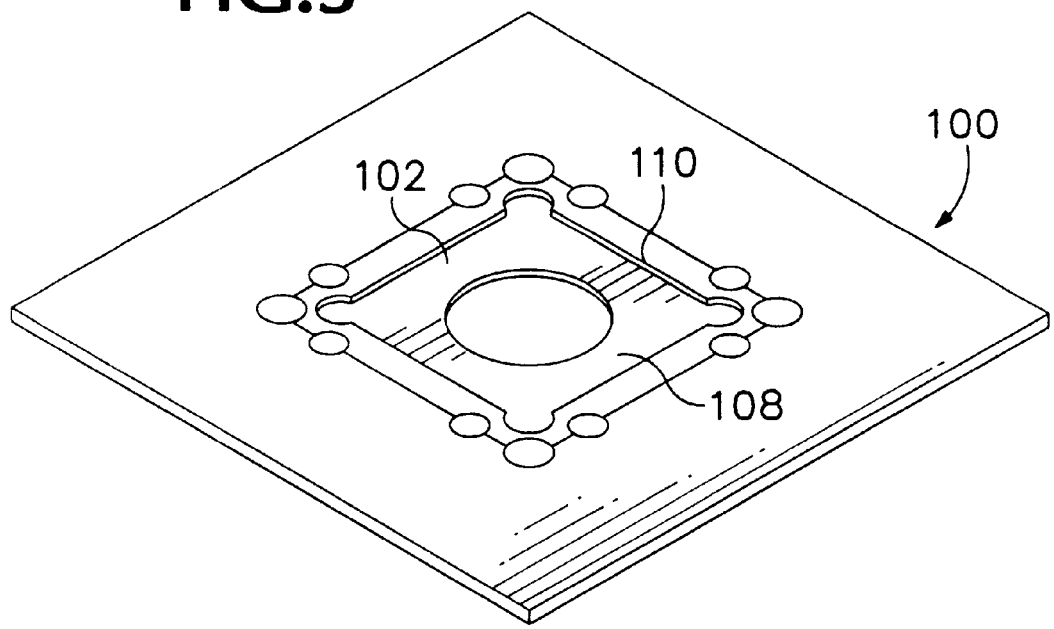

Referring to FIG. 3, a manufacturing fixture 100, preferably made of stainless steel, includes a retaining recess 102, a recess floor 108 and a ledge 110. The fixture 100 is utilized to manufacture a current PBGA package 30 (FIG. 2). Fixture 100 is designed to hold a stiffener ring 32 and the PBGA member 22 during the manufacturing process. A stiffener ring 32 is placed down onto the floor 108 of fixture 100. An adhesive layer 34 is then applied to stiffener ring 32 by, for example, an Asymtek device, which is an apparatus known to the industry. Stiffener ring 32 is preferably a zinc plated copper ring, but may also be black oxide coated copper or anodized aluminum.

After the adhesive layer 34 has been applied to the stiffener ring 32, the singulated PBGA member 22 is placed within the recess 102 of fixture 100 and onto the ledge 110 of fixture 100 such that the outer perimeter of die attach surface 40 of member 22 rests on ledge 110, and the adhesive layer 34, which has been applied to stiffener ring 32, is in adhesive contact with the die attach surface 40 of member 22. Use of fixture 100 ensures that the PBGA member 22 and stiffener ring 32 align with each other and are coplanar to within +/-3 mils (+/-0.003 inches).

After PBGA member 22 and stiffener ring 32 are in adhesive contact with each other within fixture 100, a top plate 106 is placed over the top of fixture 100. In this position, the solder ball attach surface 50 of PBGA member 22 is covered by top plate 106. Top plate 106 and fixture 100 are then clamped together using known means so stiffener ring 32 and PBGA member 22 are secured tightly together, to form a stack assembly. The stack assembly is then placed into a curing oven to cure the adhesive layer 34, which bonds the stiffener ring 32 and the die attach surface 40 of member 22 together. After curing, the top plate 106 is removed and the bonded ring 32 and member 22 are dislodged from fixture 100. The PBGA member 22, with stiffener ring 32 attached, is now ready for die attach, wire bonding, encapsulation and solder bail attach.

At this point in the manufacturing process, an integrated circuit die 16 is selected and then attached to the die attach surface 40 of member 22 inside the periphery of the attached stiffener ring 32. Bonding wires 18 (FIG. 2) are then attached to the bonding pads 44 of die 16 using known methods. A low stress, low viscosity epoxy, preferably Hysol 4450 compound, is then dispensed onto the die attach surface 40 of member 22 such that the die 16 and bonding wires 18 are encapsulated withing the epoxy which forms encapsulant 14. Solder balls 20, preferably 30 mils in diameter, are selectively attached to solder ball pads 52 disposed on the solder ball attach surface 50 of member 22.

What is claimed is:

1. A method of manufacturing a plastic ball grid array assembly, (PBGA) comprising the steps:

providing a resilient PBGA member having a die attach surface and a solder ball attach surface, said solder ball attach surface opposite the die attach surface, wherein the solder ball attach surface includes a two-dimensional matrix of solder balls arranged on the solder ball attach surface around a periphery and within a central portion of the solder ball attach surface;

providing a stiffener ring;

providing a stiffener fixture which includes a retaining recess having a floor for receiving said stiffener ring, and includes a ledge positioned above said recess floor for receiving said PBGA member;

placing said stiffener ring onto said retaining recess floor;

applying an adhesive layer to said stiffener ring;

placing said PBGA member onto said ledge in said stiffener fixture, wherein said stiffener ring and said PBGA member are essentially coplanar, and wherein said PBGA member is in contact with said adhesive layer;

providing a top plate which is placed on top of said PBGA member disposed on the ledge within said recess;

securing together said top plate, PBGA member, stiffener ring and stiffener fixture to form a stack assembly, wherein a periphery of the PBGA member is pressed against the ledge and retained by the ledge in a coplanar relationship with the stiffener ring supported by the recess floor inward of the periphery of the PBGA member; and curing said adhesive layer to bond together said stiffener ring and said PBGA member in said coplanar relationship by heating said stack assembly.

2. The method of claim 1, wherein said stiffener ring comprises copper.

3. The method of claim 2, wherein said copper is zinc plated.

4. The method of claim 1, wherein said die attach surface of said PBGA member is placed in contact with said adhesive layer on said stiffener ring.

5. The method of claim 1, wherein said PBGA member and said stiffener ring are aligned and coplanar within said retaining recess to within +/−3 mils.

6. The method of claim 1, wherein prior to said step of providing a PBGA package, a plurality of PBGA members are arranged together in a strip and are then separated from one another to provide individual PBGA members.

7. The method of claim 1, further comprising the step of attaching an integrated circuit die to said die attach surface of said PBGA member, after said step of curing.

8. The method of claim 7, further comprising the step of selectively connecting said attached die to select signal conductors disposed on said die attach surface of said PBGA member.

9. The method of claim 8, further comprising the step of encapsulating said attached die and selected connections, within said stiffener ring.

* * * * *